United States Patent [19]

Makowiecki et al.

[11] Patent Number: 5,428,882
[45] Date of Patent: Jul. 4, 1995

[54] PROCESS FOR THE FABRICATION OF ALUMINUM METALLIZED PYROLYTIC GRAPHITE SPUTTERING TARGETS

[75] Inventors: Daniel M. Makowiecki; Philip B. Ramsey, both of Livermore; Robert S. Juntz, Hayward, all of Calif.

[73] Assignee: The Regents of the University of California, Oakland, Calif.

[21] Appl. No.: 42,704

[22] Filed: Apr. 5, 1993

[51] Int. Cl.⁶ .............................................. B22D 19/00
[52] U.S. Cl. ..................................... 29/527.5; 29/458; 29/527.2; 156/153; 156/272.6; 156/281; 204/298.12; 204/298.13; 219/121.64; 228/124.1; 419/68; 427/250; 427/597
[58] Field of Search ................... 29/527.2, 527.5, 458, 29/460; 427/250, 566, 597; 156/153, 154, 272.6, 281; 204/192.12, 298.12, 298.13; 228/120, 124.1, 177; 219/121.63, 121.64; 419/68

[56] References Cited

U.S. PATENT DOCUMENTS

| | | | |
|---|---|---|---|
| 4,135,286 | 1/1979 | Wright et al. | 29/420 |
| 4,341,816 | 7/1982 | Lauterbach et al. | 29/458 X |
| 4,476,151 | 10/1984 | Keller et al. | 204/298.12 |
| 4,885,134 | 12/1989 | Hatwar | 420/416 |
| 5,143,590 | 9/1992 | Strothers et al. | 204/298.12 |
| 5,215,639 | 6/1993 | Boys | 204/298.12 X |
| 5,230,459 | 7/1993 | Mueller et al. | 204/298.12 X |
| 5,282,943 | 2/1994 | Lannutti et al. | 204/192.12 |
| 5,284,539 | 2/1994 | McKernan et al. | 156/154 |
| 5,286,361 | 2/1994 | Makoweicki et al. | 204/298.12 |
| 5,306,405 | 4/1994 | Lorentz et al. | 204/298.12 X |
| 5,342,496 | 8/1994 | Stellrecht | 204/298.12 |

FOREIGN PATENT DOCUMENTS 61-291967  12/1986  Japan.
63-317667  12/1988  Japan.

*Primary Examiner*—S. Thomas Hughes
*Attorney, Agent, or Firm*—Henry P. Sartorio; L. E. Carnahan

[57] ABSTRACT

An improved method for fabricating pyrolytic graphite sputtering targets with superior heat transfer ability, longer life, and maximum energy transmission. Anisotropic pyrolytic graphite is contoured and/or segmented to match the erosion profile of the sputter target and then oriented such that the graphite's high thermal conductivity planes are in maximum contact with a thermally conductive metal backing. The graphite contact surface is metallized, using high rate physical vapor deposition (HRPVD), with an aluminum coating and the thermally conductive metal backing is joined to the metallized graphite target by one of four low-temperature bonding methods; liquid-metal casting, powder metallurgy compaction, eutectic brazing, and laser welding.

26 Claims, 5 Drawing Sheets

PROCESS FOR THE FABRICATION OF ALUMINUM METALLIZED PYROLYTIC GRAPHITE SPUTTERING TARGETS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to the fabrication of graphite sputtering targets and more specifically to the aluminum metallization and contouring of pyrolytic graphite sputter targets, and to the low-temperature joining of these metallized targets to a high thermal conductivity metal backing.

2. Description of Related Art

Sputter targets are used on a cathode sputtering apparatus to apply films or coatings of the target material on a substrate. Cathodic sputtering refers to the erosion of the cathode target material by ion bombardment that occurs when an electrical discharge is passed between electrodes in a low pressure gas. In the sputtering process inert gas ions with a positive charge are accelerated from the glow discharge, that forms between the electrodes, to the negative cathode. Erosion results from the ejection of atoms and clusters of atoms from the target surface as a result of momentum transfer from the bombarding ions. Sputtering becomes a coating process when the ejected material is deliberately condensed on a substrate suitably positioned near the cathode.

Magnetron sputtering is an effective method for producing carbon coatings from graphite targets. Magnetron sputtering uses a magnetic field to trap electrons in a region near the target surface creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Ion bombardment not only causes atoms of the target material to be ejected, but it also imparts considerable thermal energy to the target. Consequently, the target material must provide for adequate thermal transfer of the target's heat to the cooling media. This is particularly true in the case of magnetron sputtering where very large ion currents are produced causing a very intense and localized heating of the target.

Prior-art carbon sputter targets are typically made from plates of high-purity hot-pressed graphite. Although this material is high in chemical purity, it generally possesses about 15% porosity, which also introduces defects into the carbon films it produces. A more attractive material for carbon sputter targets is high-purity fully-dense pyrolytic graphite. However, the anisotropic heat transfer properties of pyrolytic graphite have prevented its use in the past as a carbon sputter target material. In the present invention, a contoured sputter target design with a thick aluminum metallization, that engineers around the heat transfer problem, is used to allow the use of pyrolytic graphite as a target material.

Carbon films deposited by magnetron sputtering are used in a variety of commercial and scientific applications. The quality of the carbon film can be adversely affected by the growth of carbon whiskers on the carbon target during the sputtering process. An observed correlation exists between the number of defects in the carbon film and the amount of whisker growth in the erosion area of the sputter target. The effect of sputtering process parameters on whisker growth has been studied and was published by Chen, et al. in "Surface-Defect Formation in Graphite Targets During Magnetron Sputtering (J. Vac. Sci. Technol. A8(4), July/August 1990). Whisker growth in a carbon target results in defects in the sputtered carbon film produced. Selection of an appropriate target design and the type of carbon in the sputter target can significantly reduce the amount of whisker growth during magnetron sputtering.

Since sputtering is a momentum transfer process where atoms of a target are ejected by striking the target surface with ions, most of the energy in the sputtering process converts to heat in the sputter target. This heat is removed by directly or indirectly cooling the sputter target. The anisotropic thermal conductivity of pyrolytic graphite makes efficient cooling by such means difficult. The limitations in the prior-art synthesis of pyrolyric graphite targets produces a target material with the low thermal conductivity c-axis normal to the target's surface. Because the high thermal conductivity a-axis and b-axis of the target material are parallel to the target's surface, heat is conducted along the target faster than it is conducted away from the target. The result is target overheating that causes inefficient sputtering of the pyrolytic graphite.

U.S. Pat. No. 4,136,213 teaches the vapor deposition of electrically conductive carbon onto oxide supports to produce electrodes. U.S. Pat. No. 4,551,216 describes a sputtering process for producing carbon films on a substrate where the coating layer is thin and possesses low conductivity. U.S. Pat. No. 4,767,517 shows a sputtering process for producing diamond-like thin film coatings. There is no mention of producing pyrolytic graphite coatings in any of these inventions.

U.S. Pat. No. 4,341,816 discloses a method for attaching cooling plates to sputter targets by plasma spraying a surface of the target with a compatible metal, alloy, or metal-glass adhesive layer, then plasma spraying the adhesive layer with a solderable metal or metal-glass mixture, and then soldering the solderable layer onto the surface of a cooling plate. The invention has embodiments for coating target bodies comprised of solderable metals, non-solderable metals, glass, ceramic oxides, and silicon. However, the invention does not take into consideration the need for metallizing and contouring pyrolytic graphite target bodies.

SUMMARY OF THE INVENTION

The present invention compensates for the thermal conductivity problems associated with prior-art synthesized targets by transferring heat into intermediately-bonded high-thermal-conductivity metal bodies positioned within the target, normal to the high thermal conductivity a- and b-axes of the pyrolytic graphite material. The present invention further incorporates design features that take into consideration the erosion area of the target material, to produce a sputter target that will offer the longest possible life.

Accordingly, it is an object of this invention to provide a method for forming monolithic or segmented graphite sputter targets in which the graphite is situated in such a way that thermal energy is directed along optimal planes for maximum thermal conduction of heat away from the target.

Another object of this invention is to provide for monolithic and segmented graphite sputter targets with the planes of maximum thermal conduction serving as the target surface such that maximum energy is transmitted from the sputtering surface.

Another object of this invention is to provide for the contouring of the graphite and the thermally conductive metal in the sputter target such that target erosion is compensated for to yield longer target life.

Another object of this invention is to provide a method for metallizing the graphite for the purpose of joining it to a thermally conductive metal part of the sputter target to assist in carrying heat away from the target.

Another object of this invention is to provide a liquid-metal casting method for the low-temperature joining of the metallized surface of a pyrolytic graphite sputter target to a thermally conductive metal.

Another object of this invention is to provide a powder-metallurgy compaction method for the low-temperature joining of the metallized surface of a pyrolyric graphite sputter target to a thermally conductive metal.

Another object of this invention is to provide a eutectic brazing method for the low-temperature joining of the metallized surface of a pyrolytic graphite sputter target to a thermally conductive metal.

Another object of this invention is to provide a laser welding method for the low-temperature joining of the metallized surface of a pyrolytic graphite sputter target to a thermally conductive metal.

Briefly, the invention comprises contouring and/or segmenting a monolithic piece of graphite to closely match the erosion profile created by the sputtering process and/or to maximize the energy transmitting and heat carrying ability of the graphite, then metallizing the contoured/segmented graphite surface using a physical vapor deposition process, then bonding it to a reciprocal contoured piece of a thermally conductive metal using one of several low-temperature joining methods, and then machining the composite target to a final configuration.

BRIEF DESCRIPTION OF THE DRAWINGS

The various novel features of this invention, along with the foregoing and other objects as well as the invention itself both as to its organization and method of operation, may be more fully understood from the following description of the illustrated embodiments when read in conjunction with the accompanying drawings wherein:

FIG. 4b is a typical temperature versus time plot of the aluminum metallization process carried out in the aluminum coating apparatus of FIG. 4a.

DETAILED DESCRIPTION OF THE INVENTION

Figure 1:
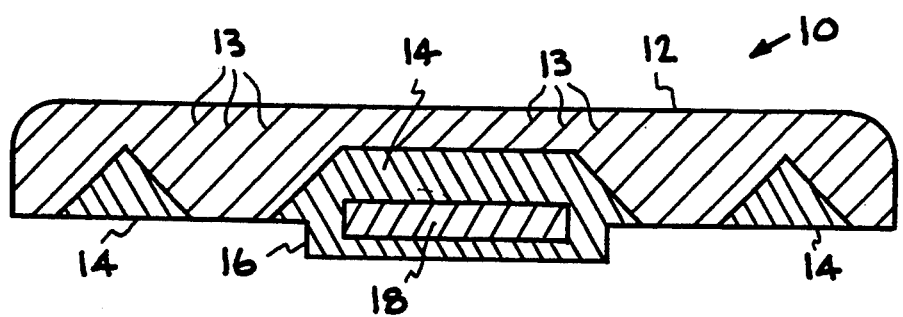
FIG. 1 is a schematic cross-section view of a finished aluminum metallized pyrolytic graphite sputtering target fabricated in accordance with one of the embodiments of the present invention.

Referring to FIG. 1, there is shown a finished aluminum metallized pyrolytic graphite sputtering target 10 with pyrolytic graphite sputter material 12 positioned such that the edges of a large number of high thermal conductivity planes 13 are in contact with the high thermal conductivity metal 14 of the sputtering target 10. The preferred material for the high thermal conductivity metal 14 is aluminum or an alloy of aluminum. Optional alignment and positioning step 16 and embedded magnetically permeable material 18, in accordance with the application titled "Magnetically Attached Sputter Targets," by Makowiecki, et al., Ser. No. 07/962,657, filed Oct. 19, 1992, now U.S. Pat. No. 5,286,361 issued Feb. 15, 1994, are also shown.

Figure 2:
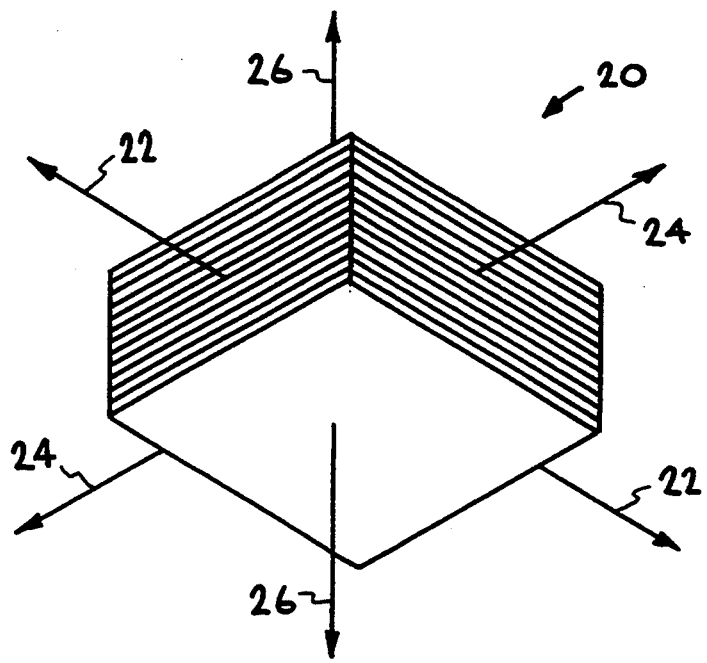
FIG. 2 is a perspective schematic representation of the anisotropy associated with pyrolytic graphite materials showing high thermal conductivity and low thermal conductivity directions.

Referring now additionally to FIG. 2, the anisotropic structure 20 of pyrolytic graphite is illustrated showing several parallel high thermal conductivity planes defined by the high thermal conductivity axes 22 and 24, and also showing the low thermal conductivity axis 26 perpendicular to these high thermal conductivity planes.

Figure 3:
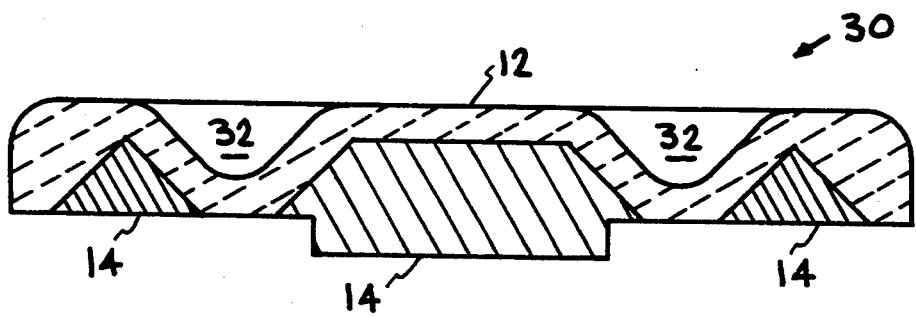
FIG. 3 is a schematic cross-section view of a finished aluminum metallized pyrolytic graphite sputtering target, fabricated in accordance with one of the embodiments of the present invention, illustrating a target configuration designed to compensate for the erosion of the target during sputtering.

Referring now additionally to FIG. 3, the contouring design feature of the present invention is illustrated where a used aluminum metallized pyrolytic graphite sputtering target 30 is shown with sputter-erosion profiles 32 extending down into the pyrolytic graphite material 12 while completely missing the high thermal conductivity metal 14 of the used target 30.

Figure 4A:
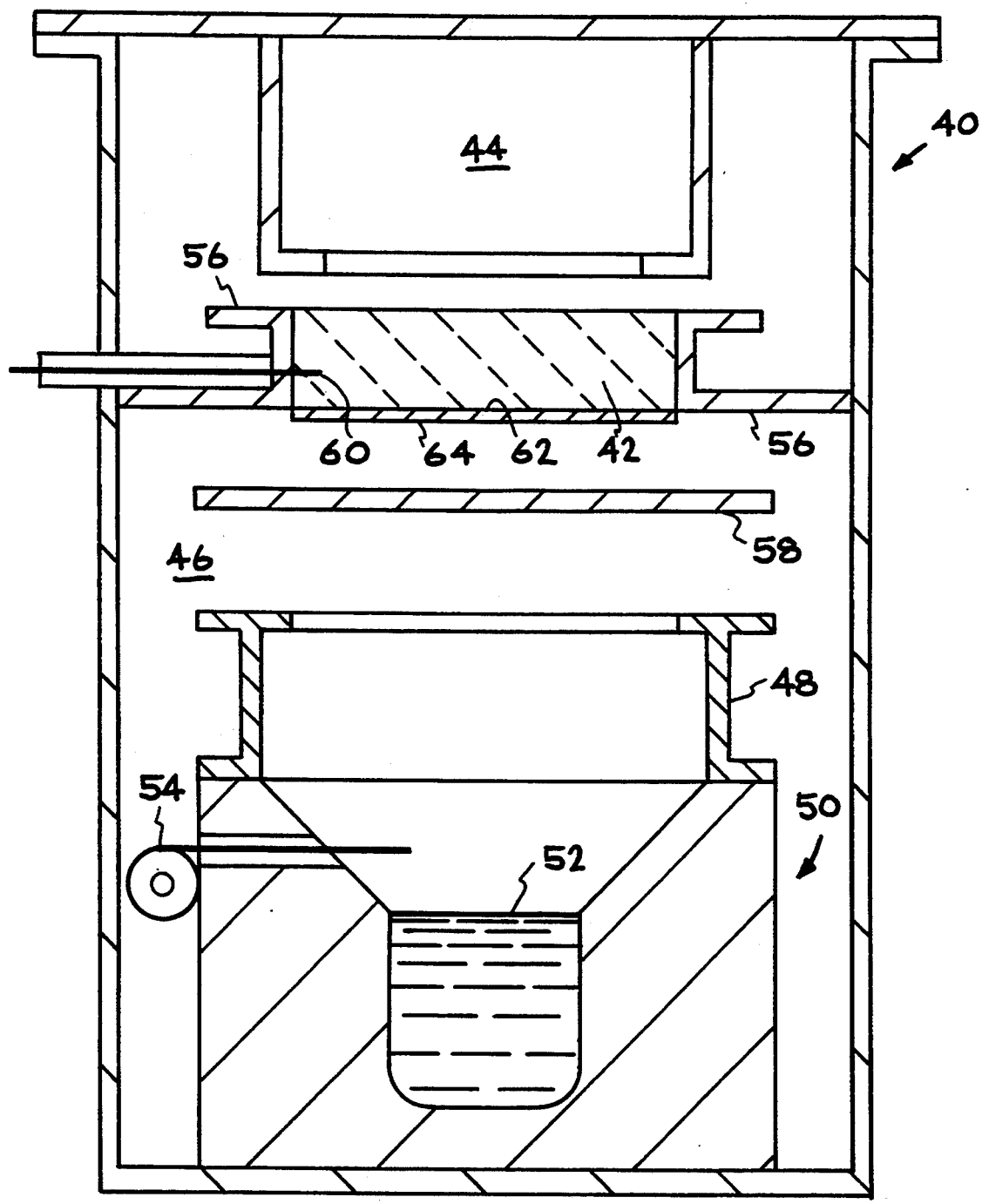
FIG. 4a is a schematic cross-section view of an aluminum coating apparatus for coating pyrolytic graphite materials, in accordance with the embodiments of the present invention, using a high rate physical vapor deposition process.

Referring to FIG. 4a, there is shown an aluminum coating apparatus 40 for the high rate physical vapor deposition (HRPVD) of an aluminum metallized coating 64 onto a pyrolytic graphite sputtering target blank 42. Prior to coating, the to-be-coated pyrolytic graphite surface 62 is hand sanded, wet, using 400 grit silicon carbide sand paper or cloth and ethyl alcohol. Approximately 50–75 $\mu$m (0.002–0.003 in) are removed by sanding in order to remove any fractured or loosely adherent graphite left from cutting or machining operations. The sanded target blank 42 is ultrasonically washed in a series of successive ethyl alcohol baths until all particulates are removed from the to-be-coated surface 62. The target blank 42 is then heated on a hot plate to drive off any absorbed alcohol remaining after the cleaning process.

Next, the clean target blank 42 is loaded into the coating apparatus 40 and the vacuum chamber 46 is evacuated to a low pressure in the range of 1E-6 to 4E-6 torr. The target blank 42 is then elevated in temperature with a heater 44 to approximately 800° C., under vacuum, to further drive off any residual alcohol and water. The temperature is monitored with a thermocouple 60. Pressure recovery from this degassing step typically takes about 5 minutes. After degassing, the heater 44 is turned off and the target blank 42 is allowed to cool to approximately 400° C. in the coating apparatus 40. During cooling, the electron beam gun 50 is brought up to operating conditions. The electron beam gun 50 heats a body of aluminum evaporant 52 that is replenished, as required, by an aluminum wire feed assembly 54. When the target blank 42, as monitored by the thermocouple 60, reaches a temperature between 450°–500° C., under vacuum, shutter 58 is opened and the aluminum evaporant 52 is channeled through the gun shield 48 and physically vapor deposited for 1–2 minutes allowing for the deposition of approximately 25–50 $\mu$m (0.001–0.002 in) of aluminum metallized coating 64 onto the target blank 42. The aluminum coating 64 is restricted to the to-be-coated surface 62 by way of vapor shields 56 surrounding target blank 42.

Next, power to the electron beam gun 50 is reduced to idle and the target blank 42 is raised in temperature again, by the heater 44, to a temperature of between 750°–800° C., as monitored by the thermocouple 60. This heating step allows the oxide-free aluminum coating 64 to readily react with the pyrolytic graphite surface 62 to form a strong bond. This bond is so strong that peel tests of the coating from the graphite show complete carbon pull out with no exposed aluminum. The heater 44 is again turned off and the target blank 42 allowed to cool while the power to the electron beam gun 50 is restored to re-establish coating conditions. Additional aluminum evaporant 52 is deposited until the desired thickness of metallized coating 64 is achieved. This generally takes approximately 20 minutes with a 10 kW power source to the electron beam gun 50. The aluminum evaporant 52 to target blank 42 distance is typically 7.6 cm (3.0 in). The aluminum evaporant 52 is usually replenished with aluminum using the aluminum wire feed assembly 54 midway through the coating run. Typically, 125 $\mu$m (0.005 in) of aluminum metallized coating 64 can be deposited, in approximately 10 minutes, onto the target blank 42 before the aluminum evaporant 52 must be replenished. After the HRPVD process is complete, the power to the electron beam gun 50 is shut off and the vacuum chamber 46 is back filled with argon gas to assist the cooling of the aluminum metallized pyrolytic graphite target blank 42.

Figure 4B:
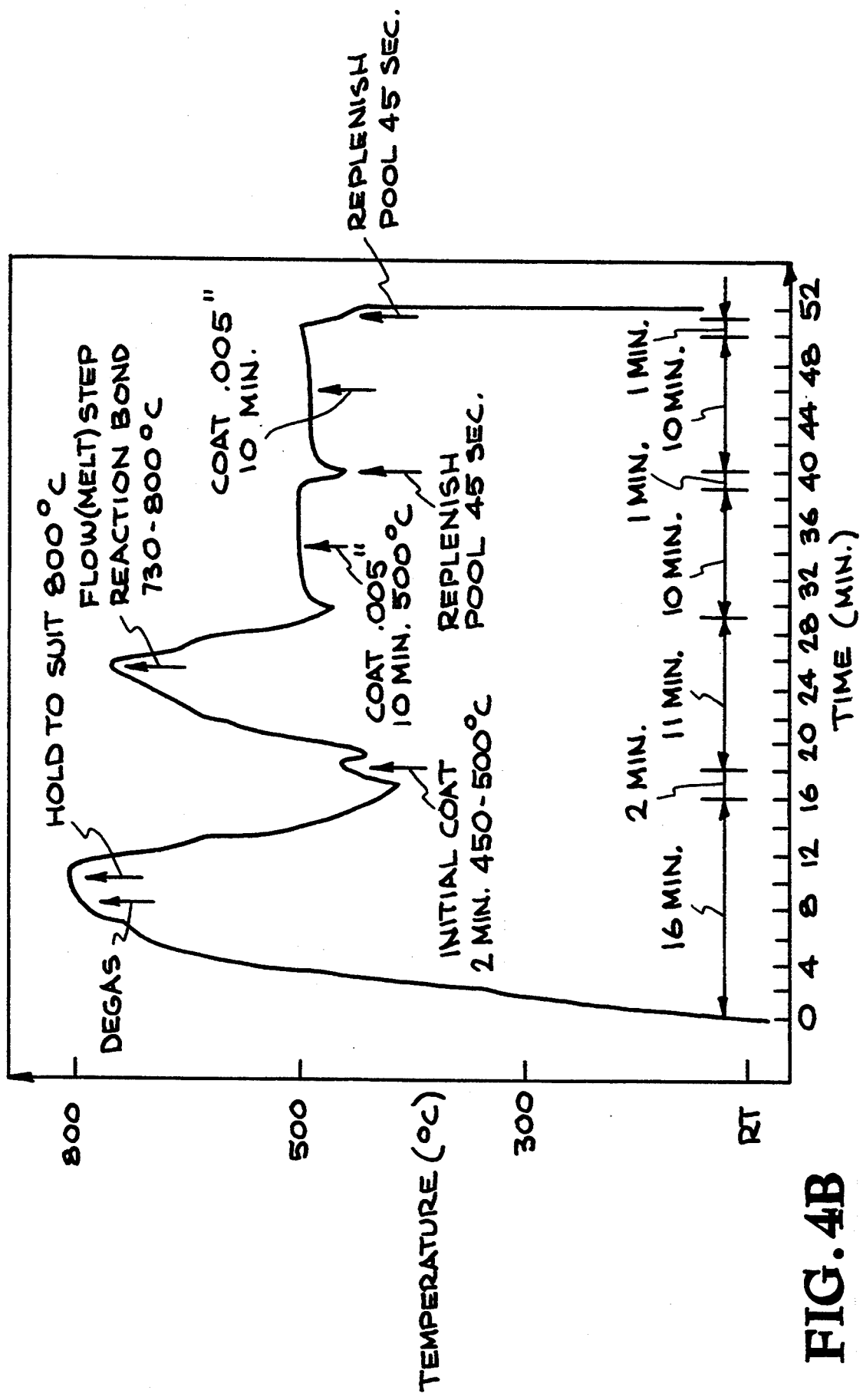

A typical metallization process is depicted in FIG. 4b where a temperature versus time plot shows the degassing, initial metallization, reaction bonding, subsequent metallization, and replenishing steps.

Figure 5:
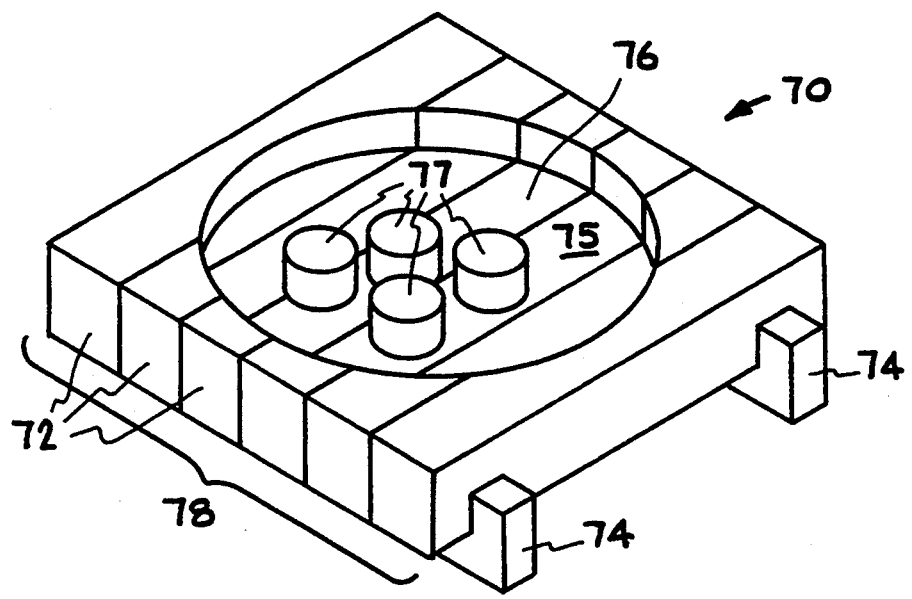
FIG. 5 is a schematic representation of the fixturing and set up for applying a high thermal conductivity metal backing to a metallized and recessed segmented pyrolytic graphite sputter target blank, in accordance with one embodiment of the present invention, using a liquid-metal casting method.

Referring to FIG. 5, there is shown the assembly 70 for the liquid metal casting of a high thermal conductivity metal backing to a metallized and recessed segmented pyrolytic graphite sputtering target blank 78, where high thermal conductivity metal stock 77 is positioned in a machined depression 76 that has been metallized with an aluminum coating 75 using the HRPVD process. The preferred material for the high thermal conductivity metal stock 77 is aluminum or an alloy of aluminum. The segmented target blank, which is fabricated in accordance with the application Ser. No. 08/042,668 filed Apr. 5, 1993, now U.S. Pat. No. 5,284,539, issued Feb. 8, 1994, titled "Segmented Pyrolytic Graphite Sputtering Targets," by McKernan, et al., is held in place by clamps 74. The clamps 74 are used to hold the segmented pyrolytic graphite strips 72 together during the machining of the depression 76. Next, the segmented strips 72, held by clamps 74, are washed with ethyl alcohol, dried, and metallized with a 25–50 $\mu$m (0.001–0.002 in) thick coating of aluminum 75 using the HRPVD process of FIG. 4a. The metallized clamped assembly 70, with the high thermal conductivity metal stock 77 resting in the machined depression 76, in place in a vacuum furnace and raised to the proper wetting temperature to allow a continuous liquid metal cast of the high thermal conductive stock 77 to form across the segmented strips 72 in the depression 76. The finished metallized pyrolytic graphite sputtering target is then machined from the circular area defined by the depression 76, thereby providing a solid metal backing which holds the pyrolytic graphite strips 72 together.

Figure 6:
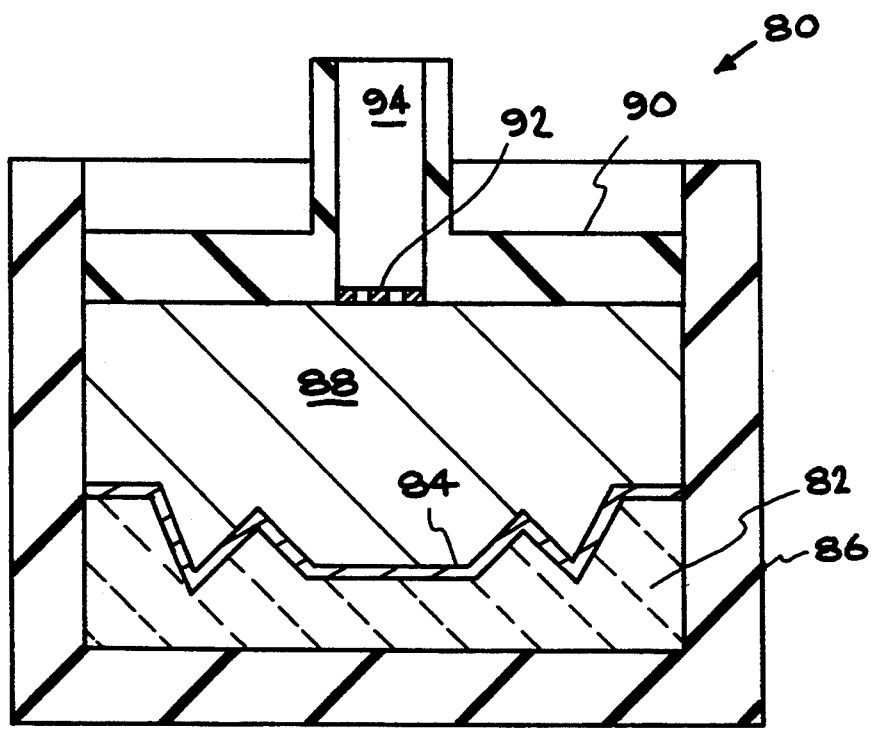
FIG. 6 is a schematic representation of the fixturing and set up for applying a high thermal conductivity metal backing to a metallized and contoured monolithic pyrolytic graphite sputter target blank, in accordance with one embodiment of the present invention, using a powder metallurgy compaction method.

Referring to FIG. 6, there is shown the assembly 80 for the powder metallurgy compaction of a high thermal conductivity metal backing to a metallized and contoured monolithic pyrolytic graphite sputtering target blank 82, where high thermal conductivity metal powder 88 is compacted in a silicone rubber bag 86 atop the target blank 82 that has been metallized on the contoured surface with an aluminum coating 84 using the HRPVD process. The preferred material for the high thermal conductivity metal powder 88 is aluminum or an alloy of aluminum. The hand-compacted metal powder 88 and metallized target blank 82 are sealed in the silicone rubber bag 86 by a silicon rubber lid 90 and the assembly is evacuated by pulling a vacuum through an evacuation channel 94 and a permeable screen 92 that stops the metal powder 88 from being sucked out during evacuation. The evacuation channel 94 is then sealed or clamped shut and the evacuated assembly is placed in a cold isostatic press and isostatically pressed at 207–345 MPa (30,000–50,000 psi), resulting in a dense consolidation of the high thermal conductivity metal powder 88 to the metallized aluminum coating 84. The pressed target assembly is then final machined to the desired dimensions (e.g., as shown in FIG. 1).

Figure 7:
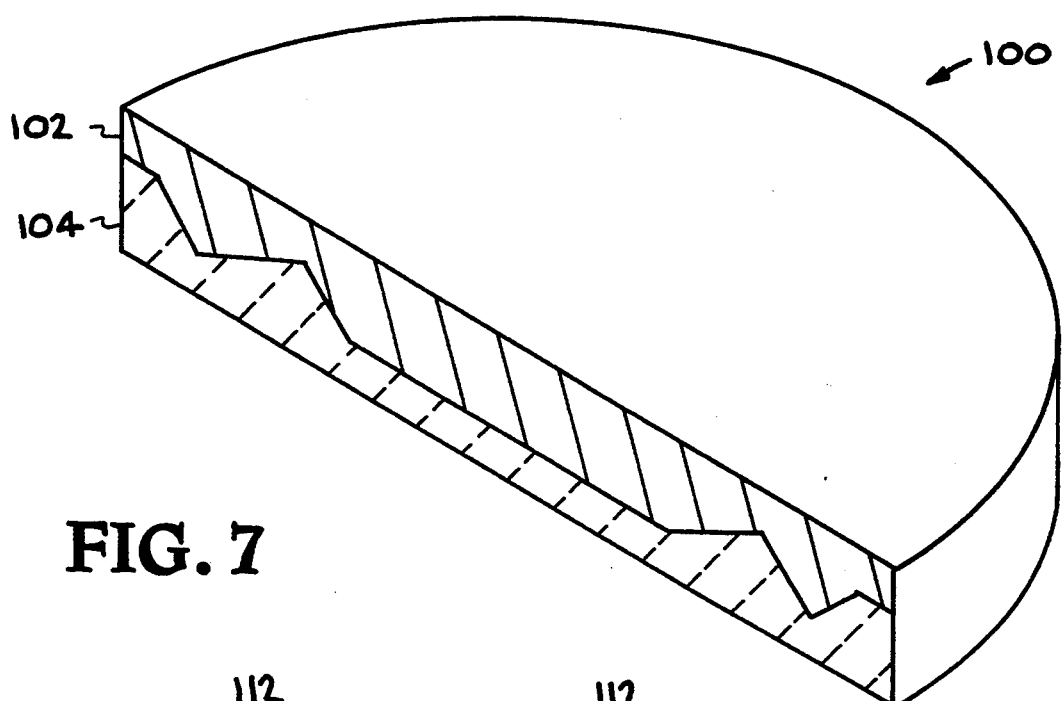
FIG. 7 is a cross-section view of an unfinished aluminum metallized and contoured monolithic pyrolytic graphite sputter target with an aluminum high thermal conductivity backing fabricated by either the powder metallurgy compaction method of FIG. 6 or the liquid-metal casting method of FIG. 5, in accordance with the embodiments of the present invention, before it is final machined to the configuration shown in FIG. 1.

Referring additionally to FIG. 7, there is shown an unfinished metallized and contoured monolithic pyrolytic graphite sputter target 100, where an aluminum high thermal conductivity backing 102 has been either powder metallurgy pressed or liquid metal cast onto a contoured monolithic pyrolytic graphite target blank 104. Note that when aluminum or an alloy of aluminum is used as the high thermal conductivity backing material, the metallized aluminum coating (75 in FIG. 5 and 84 in FIG. 6) itself becomes an integral part of the aluminum backing 102.

Figure 8:
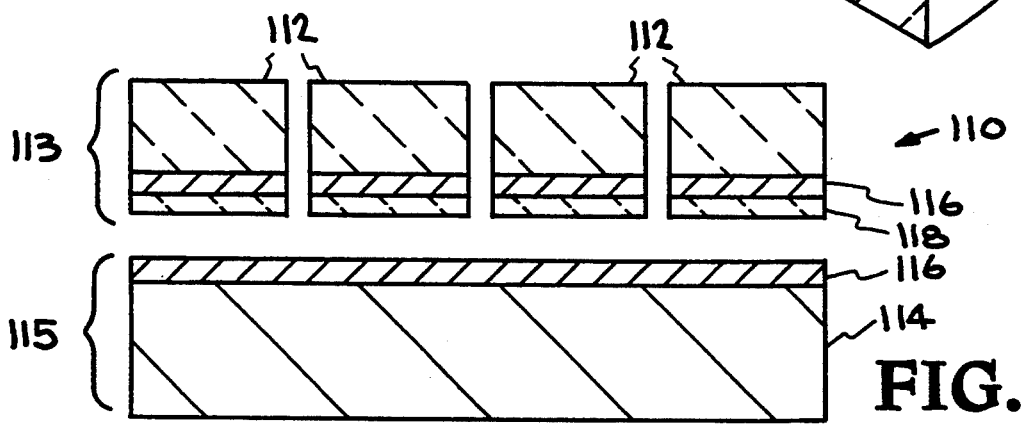
FIG. 8 is a cross-section view of the set up for applying a high thermal conductivity metal backing to metallized segments of pyrolytic graphite, in accordance with one embodiment of the present invention, using an aluminum-silicon eutectic braze method.

Referring to FIG. 8, there is shown the assembly 110 for the aluminum-silicon eutectic brazing of a metallized high thermal conductivity metal backing plate 115 to doubly metallized segments 113 of pyrolytic graphite 112, where the high thermal conductivity backing metal 114 and the mating surfaces of the individual graphite segments 112 are metallized with an aluminum coating 116 using the HRPVD process, and then at least one of the aluminum coatings 116 is subsequently metallized with a silicon coating 118 using the HRPVD process, where the aluminum evaporant is replaced with a silicon evaporant. The doubly metallized pyrolytic graphite segments 113 and the single (or doubly) metallized metal backing plate 115 form two subassemblies that are then placed in contact with each other and heated in a brazing furnace, to a eutectic temperature of the aluminum-silicon system. The preferred backing metal 114 is aluminum or an alloy of aluminum and the use of an aluminum-silicon brazing system allows for strong liquid-metal bonding at a eutectic temperature below the melting point of the aluminum.

Figure 9:
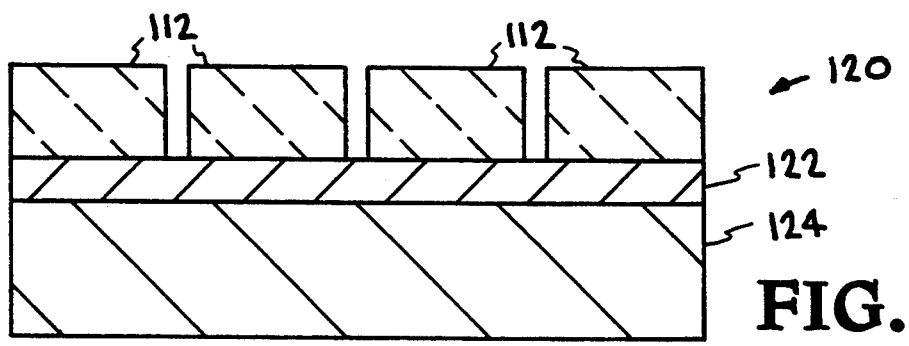
FIG. 9 is a cross-section view of an unfinished aluminum metallized and segmented pyrolytic graphite sputter target fabricated by an aluminum-silicon eutectic braze method, in accordance with one embodiment of the present invention.

Referring additionally to FIG. 9, there is shown an unfinished metallized and segmented pyrolytic graphite sputter target 120, where an aluminum high thermal conductivity backing 124 has been brazed to several pyrolytic graphite segments 112 with an aluminum-silicon eutectic alloy braze 122.

Figure 10:
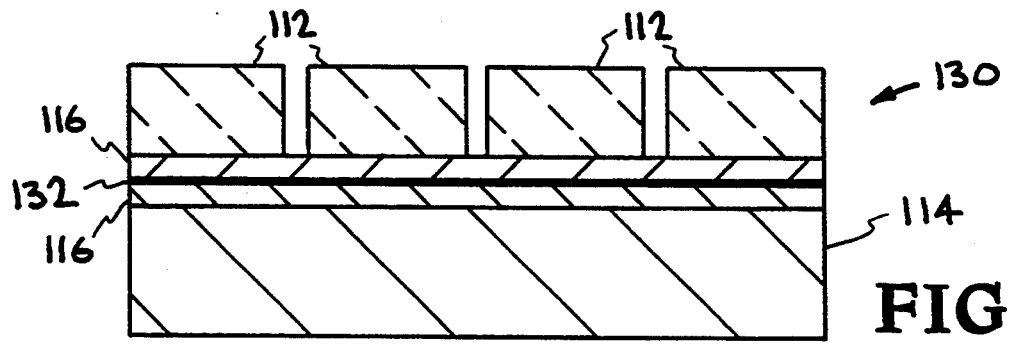
FIG. 10 is a cross-section view of an unfinished aluminum metallized pyrolytic graphite sputter target fabricated by an aluminum laser welding method, in accordance with one embodiment of the present invention.

Referring to FIG. 10, there is shown an unfinished metallized and segmented pyrolytic graphite sputter target 130, where a high thermal conductivity metal backing plate 114 with a metallized aluminum coating 116 has been bonded to segments of pyrolytic graphite 112 also with aluminum metallized coatings 116 using a laser weld 132.

The present invention is superior over other graphite sputtering targets where the thermal anisotropy and porosity of graphite and target erosion are not taken into consideration. Such inferior designs have severe overheating problems due to the structural anisotropy of graphite and the lack of an intermediate high thermal conductivity metal bonded to the graphite to carry heat away fast enough. The pyrolytic sputter target functions without overheating because the heat is transferred into the intermediately bonded metal along the conducting graphite axes.

A 2-dimensional computer model was used to compare the surface temperatures of a flat monolithic pyrolytic graphite sputter target with a low thermal conductivity axis normal to the sputtering surface to a contoured monolithic aluminum metallized pyrolytic graphite sputtering target with the same low thermal conductivity axis orientation but also with a liquid-metal cast aluminum backing. Literature values of thermal conductivity were used for aluminum and pyrolytic graphite. The deposition of 200 Watts of power to the surface of a 3.3 cm (1.3 in) diameter sputter target predicted a maximum surface temperature of 600° C. for the flat nonmetallized target and only 100° C. for the contoured metallized target.

Further, when very simple target shapes (e.g., discs) are used they do not introduce a contour that is commensurate with the sputtering erosion profile of the target. By designing a contour to match the erosion profile, target life is greatly extended. Furthermore, thermally conductive paste is often used between the graphite and the backing plate to enhance sputter target cooling. When used in conjunction with porous graphite targets, wicking to the sputtering surface often occurs contaminating the material to be deposited. By using fully dense pyrolytic graphite bonded to a good metal conductor, wicking and contamination problems are avoided.

In the present invention, a collection of several processes are used to ultimately join pyrolytic graphite to itself and to thick sections of high thermal conductivity metal, preferably aluminum or an alloy of aluminum, to fabricate pyrolytic graphite sputtering targets with improved heat dissipating quality and longer life. The key to this invention, and applicable to all of the processes, is the application of a dense, high-purity, adherent aluminum coating to the pyrolytic graphite by high rate physical vapor deposition (HRPVD). This coating is the basis for the subsequent joining processes involving liquid-metal casting, powder metallurgy compaction, eutectic brazing, or laser welding.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

We claim:

1. A method of fabricating an aluminum metallized pyrolytic graphite sputtering target comprising the steps of:

providing a pyrolytic graphite sputter target having a sputtering surface and an opposed back surface;

forming the pyrolytic graphite such that a number of edges of high thermal conductivity planes in the graphite is maximized along said back surface of the target;

preparing said back surface to receive a metallized coating of aluminum by abrading the surface to improve adherence of the coating and washing the surface to remove residual particles from the abrading process;

metallizing said back surface with a coating of aluminum using a high rate physical vapor deposition process;

joining a thermally conductive metal to said aluminum metallized pyrolytic graphite sputter target; and machining said aluminum metallized pyrolytic graphite sputter target to a desired geometry.

2. The method of claim 1, wherein said abrading step further comprises wet sanding said back surface with an abrasive material and said washing step further comprises ultrasonically washing said back surface with a solvent then drying said surface.

3. The method of claim 2, wherein said abrasive material is about 400 grit silicon carbide sand paper or cloth and said wet sanding step is performed by hand using ethyl alcohol.

4. The method of claim 2, wherein said solvent is ethyl alcohol, said washing step is performed in successive ultrasonic baths of said solvent and said drying step is performed by heating the washed target on a hot plate to drive off any residual absorbed solvent from the washing step.

5. The method of claim 1, wherein said preparing step further comprises machining said pyrolytic graphite sputter target to a geometry that contours an erosion profile of the target during sputtering and/or to a geometry that creates a depression for receiving the thermally conductive metal.

6. The method of claim 1, wherein said high rate physical vapor deposition process is performed in an electron-beam vacuum coating apparatus, wherein aluminum is vacuum heated to a vapor state with an electron beam gun and said aluminum vapor forms a metallized deposit on said pyrolytic graphite sputter target via a sequence of degassing, initial metallization, reaction bonding, subsequent metallization, replenishing, and cooling steps.

7. The method of claim 6, wherein said degassing step further comprises heating said sputter target to a temperature of about 800° C. in a vacuum of about 1E-6 to 4E-6 torr to drive off any residual solvent and water and then subsequently cooling the target to a temperature of about 400° C. in a vacuum of about 1E-6 to 4E-6 torr.

8. The method of claim 7, wherein said heating and cooling steps take about 16 minutes to perform.

9. The method of claim 6, wherein said initial metallization step further comprises heating said sputter target to a temperature of about 450°–500° C. in a vacuum of about 1E-6 to 4E-6 torr, then electron-beam vacuum coating said heated sputter target with an aluminum metallized coating and then subsequently cooling the target to a temperature of about 400° C. in a vacuum of about 1E-6 to 4E-6 torr.

10. The method of claim 9, wherein said vacuum coating step takes about 1–2 minutes to perform and said metallized coating is about 25–50 μm (0.001–0.002 in) thick.

11. The method of claim 6, wherein said reaction bonding step further comprises heating said sputter target to a temperature between 730°–800° C. in a vacuum of about 1E-6 to 4E-6 torr to allow the aluminum metallized coating obtained from said initial metallization step to react with the pyrolytic graphite target and to form a strong bond thereon, then subsequently cooling the target to a temperature of about 500° C. in a vacuum of about 1E-6 to 4E-6 torr.

12. The method of claim 11, wherein said reaction bonding step takes about 11 minutes to perform.

13. The method of claim 6, wherein said subsequent metallization step further comprises heating said sputter target to a temperature of about 500° C. in a vacuum of about 1E-6 to 4E-6 torr, then electron-beam vacuum coating said heated sputter target with an additional aluminum metallized coating and then subsequently cooling the target to a temperature of about 450° C. in a vacuum of about 1E-6 to 4E-6 torr.

14. The method of claim 13, wherein said subsequent metallization step takes about 10 minutes to perform and said additional metallized coating is about 125 μm (0.005 in) thick.

15. The method of claim 6, wherein said replenishing step further comprises cooling said sputter target to a temperature of about 450° C. in a vacuum of about 1E-6 to 4E-6 torr while the source of aluminum is replenished.

16. The method of claim 15, wherein said replenishing step takes about 45–60 seconds to perform.

17. The method of claim 6, wherein said replenishing step follows said subsequent metallization step in a cyclic fashion until a desired thickness of additional metallized coating is obtained on the pyrolytic graphite sputter target.

18. The method of claim 6, where said cooling step further comprises cooling said sputter target to ambient temperature in 1 atm of argon gas.

19. The method of claim 1, wherein said joining step further comprises bonding said metallized sputter target to said thermally conductive metal using a method selected from the group consisting of liquid-metal casting, powder metallurgy compaction, eutectic brazing, and laser welding.

20. The method of claim 19, wherein said bonding is carried out by said liquid-metal casting method which further comprises the steps of:
positioning said thermally conductive metal on the back surface of the aluminum metallized pyrolyric graphite sputter target; and
heating said conducting metal and sputter target together in a vacuum furnace raised to a temperature where the conducting metal will melt and wet said back surface of the target.

21. The method of claim 19, wherein said bonding is carried out by said powder metallurgy compaction method which further comprises the steps of:
providing a powder form of said thermally conductive metal;
placing said aluminum metallized pyrolytic graphite sputter target in a silicone rubber bag such that the metallized surface is positioned to receive said thermally conductive metal powder;
hand compacting said metal powder on top of the sputter target and into the rubber bag;
sealing said compacted metal and target in said rubber bag with a silicone rubber lid;
evacuating the inside of said sealed rubber bag with a vacuum through an evacuation channel to the sealed rubber bag;
clamping or sealing said evacuation channel after the metal powder and sputter target are in a vacuum environment;
cold isostatically pressing the evacuated and sealed assembly; and
removing said metallized pyrolytic graphite target with the compacted conductive metal attached from the rubber bag.

22. The method of claim 21, wherein said cold isostatic pressing step is conducted at an isostatic pressure of between 207–345 MPa (30,000–50,000 psi).

23. The method of claim 19, wherein said bonding is carried out by said eutectic brazing method which further comprises the steps of:
metallizing the aluminum metallized side of said aluminum metallized pyrolytic graphite sputter target with a coating of silicon using a high rate physical vapor deposition process for silicon;
metallizing the side to be joined with said silicon metallized aluminum metallized pyrolytic graphite sputter target of said thermally conductive metal with a coating of aluminum using said high rate physical deposition process for aluminum;
metallizing said aluminum metallized side of said thermally conductive metal with a coating of silicon using said high rate physical deposition process for silicon;

positioning said silicon metallized side of the target against said silicon metallized side of the thermally conductive metal; and heating said assembly in a brazing furnace to a eutectic temperature of the aluminum-silicon system below the melting point of the thermally conductive metal.

24. The method of claim 19, wherein said bonding is carried out by said laser welding method which further comprises the steps of:

metallizing the side to be joined with said aluminum metallized pyrolytic graphite sputter target of said thermally conductive metal with a coating of aluminum using said high rate physical deposition process for aluminum;

positioning said aluminum metallized side of the target against said aluminum metallized side of the thermally conductive metal; and welding the two aluminum metallized surfaces together with a laser welder.

25. The method of claim 1, wherein said pyrolytic graphite sputter target is segmented.

26. The method of claim 1, wherein said thermally conductive metal is selected from the group consisting of aluminum and an alloy of aluminum.

* * * * *